(12) United States Patent
Miyoshi

(10) Patent No.: US 10,641,437 B2
(45) Date of Patent: May 5, 2020

(54) LED MODULE

(71) Applicant: NICHIA CORPORATION, Anan-shi, Tokushima (JP)

(72) Inventor: Tomonori Miyoshi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 272 days.

(21) Appl. No.: 15/636,804

(22) Filed: Jun. 29, 2017

(65) Prior Publication Data

US 2018/0003349 A1    Jan. 4, 2018

(30) Foreign Application Priority Data

Jun. 30, 2016 (JP) .................. 2016-129499
Mar. 27, 2017 (JP) .................. 2017-060500

(51) Int. Cl.
   *F21Y 115/10* (2016.01)
   *F21K 9/62* (2016.01)
   *H01L 25/075* (2006.01)
   *H01L 33/60* (2010.01)

(52) U.S. Cl.
   CPC ............ *F21K 9/62* (2016.08); *H01L 25/0753* (2013.01); *F21Y 2115/10* (2016.08); *H01L 33/60* (2013.01)

(58) Field of Classification Search
   CPC ..... F21Y 2105/10; F21V 13/04; F21V 29/505
   USPC .......... 362/227, 235, 242, 243, 247
   See application file for complete search history.

(56) References Cited

U.S. PATENT DOCUMENTS

| | | | |
|---|---|---|---|
| 2004/0218390 A1 | 11/2004 | Holman et al. | |
| 2007/0228392 A1 | 10/2007 | Plank et al. | |
| 2010/0163891 A1* | 7/2010 | Ku | F21S 10/02 257/88 |
| 2011/0175117 A1* | 7/2011 | Jagt | H01L 33/44 257/88 |
| 2011/0286200 A1* | 11/2011 | Iimura | F21V 7/041 362/84 |
| 2015/0311405 A1 | 10/2015 | Oyamada et al. | |
| 2015/0316215 A1 | 11/2015 | Togawa | |

(Continued)

FOREIGN PATENT DOCUMENTS

| | | |
|---|---|---|
| EP | 2930749 A1 | 10/2015 |
| EP | 2963685 A1 | 1/2016 |

(Continued)

*Primary Examiner* — William J Carter
(74) *Attorney, Agent, or Firm* — Global IP Counselors, LLP

(57) ABSTRACT

An LED module includes a mounting board and LED devices. The LED devices include at least one first LED device and second LED devices each including a light emitting diode element, a reflective member disposed lateral to the light emitting diode element, and a light transmissive member disposed above the light emitting diode element. The first LED device includes a reflective member on all lateral faces of the light transmissive member, and its upper face serves as a light extraction face. The second LED devices each includes the reflective member covering all of the lateral faces of the light transmissive member facing the at least one of the LED devices so that all of the lateral faces of the light transmissive members not facing any one of the LED devices and an upper face of a corresponding one of the second LED devices serve as light extraction faces.

18 Claims, 7 Drawing Sheets

(56) References Cited

U.S. PATENT DOCUMENTS

2016/0155775 A1 6/2016 Yano
2018/0003349 A1 1/2018 Miyoshi

FOREIGN PATENT DOCUMENTS

| JP | 2011-114096 A | 6/2011 | | |
|----|---------------|--------|---|---|
| JP | 2011159812 A | * | 8/2011 | ............ H01L 33/60 |
| JP | 2011-249346 A | 12/2011 | | |
| JP | 2013-182857 A | 9/2013 | | |
| JP | 2013-197439 A | 9/2013 | | |
| JP | 2014-143246 A | 8/2014 | | |
| JP | 2015-022859 A | 2/2015 | | |
| JP | 2016-115729 A | 6/2016 | | |
| JP | 6380590 B2 | 8/2018 | | |
| WO | 2014-087938 A1 | 6/2014 | | |
| WO | 2014091914 A1 | 6/2014 | | |

* cited by examiner

LED MODULE

CROSS-REFERENCE TO RELATED APPLICATION

This application claims priority to Japanese Patent Application No. 2016-129499 filed on Jun. 30, 2016, and No. 2017-060500 filed on Mar. 27, 2017, the disclosures of which are hereby incorporated by reference in their entirety.

BACKGROUND

The present disclosure relates to an LED module.

There is known an LED module in which a plurality of light emitting diode (LED) devices are arranged on a mounting board, see for example Japanese Patent Publication No. 2014-143246. In this LED module, the lateral faces of the LED devices are each constructed with a phosphor member or a reflective member, and the plurality of LED devices are arranged so that the phosphor members of certain LED devices face the reflective members of certain LED Devices.

However, in the LED module disclosed in the above patent publication, if the LED devices are arranged so that the reflective members are positioned along the outermost perimeter of the LED module, the light from the LED devices is reflected by the reflective member positioned along the outermost perimeter of the LED module to thereby reduce the light distribution of the LED module. In other words, it is difficult for the light from the LED devices to spread out from the outermost perimeter of the LED module, resulting in a narrow light distribution. Such an LED module is not suited for indoor lighting or the like, which requires a wide light distribution. Furthermore, since the lateral faces constructed with a phosphor member in certain LED devices face the lateral faces constructed with a reflective member in other LED devices, the light released from the phosphor member of a certain LED device is reflected by the reflective member of a facing LED device, and can be incident on and be absorbed by the phosphor members of other LED devices to thereby reduce the light extraction efficiency of the LED module.

SUMMARY

An LED module according to one aspect includes a mounting board and a plurality of LED devices arranged adjacent to one another on the mounting board. The LED devices include at least one first LED device and a plurality of second LED devices. All lateral faces of the at least one first LED device face corresponding ones of the plurality of LED devices. The at least one first LED device includes a light emitting diode element, a light transmissive member disposed above the light emitting diode element, and a reflective member disposed lateral to the light emitting diode element with the reflective member covering all lateral faces of the light transmissive member so that an upper face of the at least one first LED device serves as a light extraction face. The second LED devices each has at least one lateral face facing at least one of the LED devices and at least one lateral face not facing any one of the LED devices. The second LED devices each includes a light emitting diode element, a light transmissive member disposed above the light emitting diode element, and a reflective member disposed lateral to the light emitting diode element with the reflective member covering each of at least one lateral face of the light transmissive member facing the at least one of the LED devices so that each of at least one lateral face of the light transmissive member not facing any one of the LED devices and an upper face of a corresponding one of the second LED devices serve as light extraction faces.

The above construction can achieve an LED module which has a wide light distribution and an improved light extraction efficiency.

BRIEF DESCRIPTION OF DRAWINGS

A more complete appreciation of the disclosure and many of the attendant advantages thereof will be readily obtained as the same becomes better understood by reference to the following detailed description when considered in connection with the accompanying drawings.

DESCRIPTION OF THE EMBODIMENTS

Figure 1:
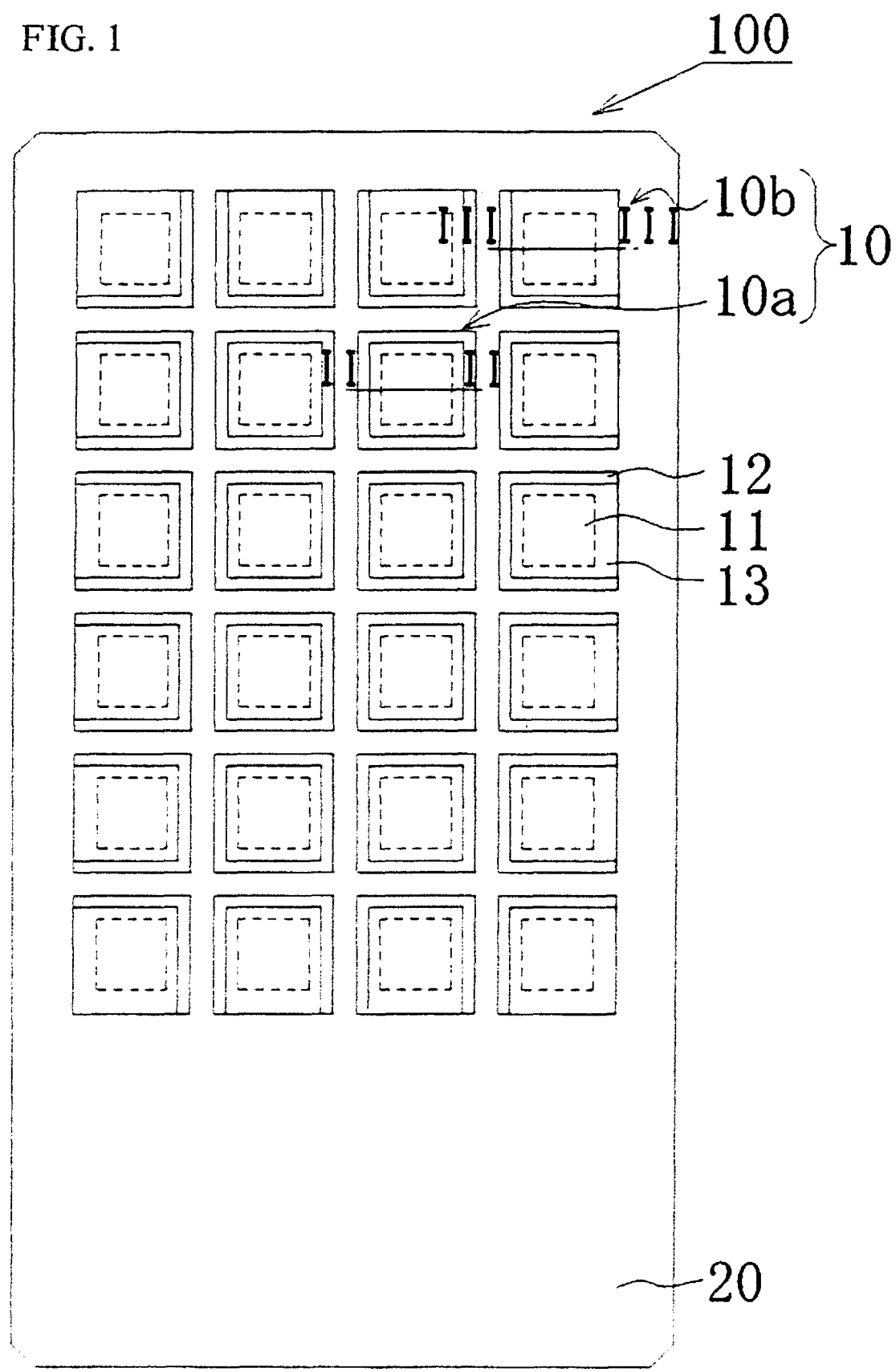
FIG. 1 is a schematic plan view of the LED module according to an embodiment of the invention.

An embodiment of the present invention will be described below with reference to the accompanying drawings. It should be appreciated, however, that the embodiment described below is an illustration to give a concrete form to technical ideas of the present invention, and do not limit the present invention. In the explanations below, the same designations and reference numerals denote the same members or those of similar quality, for which the detailed explanations will be omitted when appropriate.

Figure 2:
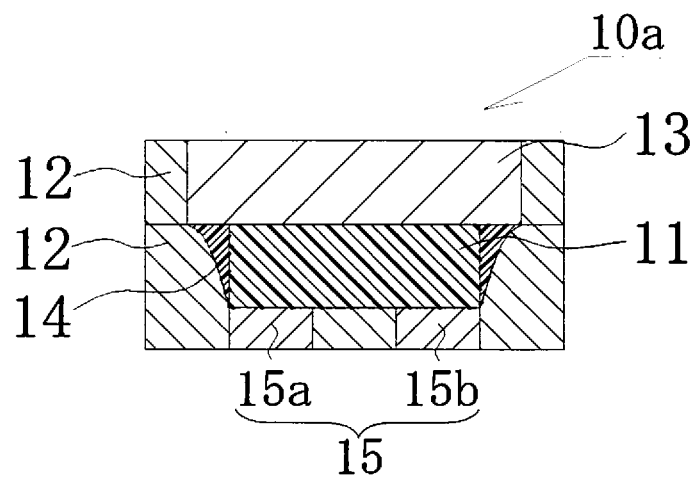
FIG. 2 is a schematic cross-sectional view of a first LED device in FIG. 1 taken along line II-II.
Figure 3:
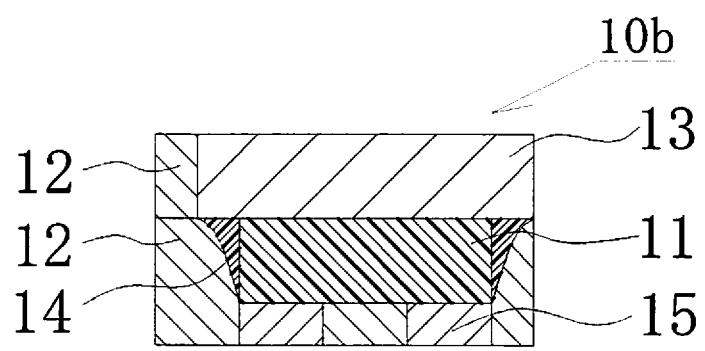
FIG. 3 is a schematic cross-sectional view of a second LED device in FIG. 1 taken along line

In the LED module 100 according to the present embodiment, as shown in FIG. 1, LED devices 10 are arranged on a mounting board 20 in such a manner as to be adjacent to one another. The LED devices 10 each has a light emitting diode element 11, and a reflective member 12 disposed along certain lateral surface of the light emitting diode element 11. A first light transmissive member 13 is disposed above each light emitting diode element 11. Here, the first light transmissive member 13 contains at least one phosphor. As shown in FIG. 1 and FIG. 2, among all the LED devices 10, the first LED devices 10a have all of their lateral faces being adjacent to other LED devices, and have a reflective member 12 disposed on all lateral faces of the first light transmissive members 13. The upper face of each of the first LED devices 10a serves as a light extraction face. On the other hand, as shown in FIG. 1 and FIG. 3, the second LED devices 10b have those lateral faces that are adjacent to other LED devices and those that are not adjacent to other LED devices. Among all lateral faces of the first light transmissive members 13, those lateral faces that are adjacent to other LED devices are provided with the reflective member 12, and those lateral faces that are not adjacent to other LED devices are light extraction faces. As well as the first LED device 10a, the upper face of each of the second LED devices serves as a light extraction face. As shown in FIG. 1, the second LED devices 10b are positioned along the outermost perimeter of the LED module 100, and the first LED devices 10a are positioned in the area other than the outermost perimeter of the LED module 100. Each first LED device 10a is surrounded by other LED devices on all sides. Since the lateral faces of the LED module 100 serve as light extraction faces, the LED module 100 can have a wider light distribution as compared to an LED module having no light extraction faces serving as their lateral faces. In other words, because the light extraction faces of the second LED devices 10b are positioned at the lateral faces of the LED module 100, light can be laterally released from the LED module 100, and thus a wide light distribution can be achieved.

Furthermore, because all lateral faces of the first light transmissive members 13 of the first LED devices 10a have the reflective member 12, the light emitted in the first LED devices 10a is reflected by the reflective members 12 and is extracted from the top of the first LED devices 10a. This can reduce the likelihood for the light emitted in the first LED devices 10a to be incident on and be absorbed by other LED devices. Similarly, because all of the lateral faces of the first light transmissive members 13 of the second LED devices 10 b that are adjacent to other LED devices have the reflective member 12, the likelihood for the light to be incident on and be absorbed by other LED devices can be reduced. In addition, the likelihood of the light from the first LED devices 10a and the second LED devices 10b being incident on and being absorbed by the mounting board 20 of the LED module 100 can also be reduced. Wherever the reflective members 12 are to be provided on the lateral faces of the first light transmissive members 13, the reflective members 12 are preferably disposed to entirely cover the lateral faces of the first light transmissive members 13. Although the second LED devices 10b have certain lateral faces serving as light extraction faces, these lateral faces are not adjacent to other LED devices. Thus, it is highly unlikely for the light to be incident on and be absorbed by other LED devices. As a result of all of the above, a decline of the light extraction efficiency of the LED module 100 can be moderated.

Furthermore, because the first light transmissive members 13 of the first LED devices 10a and the second LED devices 10b have the reflective members 12 on the lateral faces that are adjacent to other LED devices, the paths traveled by light before being extracted from the top of the LED module 100 can be shortened as compared to the case of providing no reflective members 12. This can reduce the absorption of light by the mounting board 20 or the like, thereby moderating the decline of the light extraction efficiency of the LED module 100. In other words, when there are reflective members 12 on the lateral faces of the first light transmissive members 13 of the first LED devices 10a and the second LED devices 10b, the light emitted in the LED devices 10 immediately hits the reflective members 12 and is extracted from the top of the LED devices 10. For this reason, the light can be extracted from the top of the LED module 100 before the light extraction efficiency declines.

As shown in FIG. 2 and FIG. 3, furthermore, disposing reflective members 12 on the lateral faces of the light emitting diode elements 11 can reduce the likelihood for the light generated by the light emitting diode elements 11 to be absorbed by the adjacent light emitting diode elements. The light generated at the emission layer of a light emitting diode element 11 is more readily absorbed by the material, if the material composition of a component, on which the light hits, is more similar to the composition of the emission layer. Disposing the reflective members 12 can make it more difficult for the light to be absorbed by the emission layers of adjacent light emitting diode elements or their vicinities. Wherever the reflective members 12 are to be provided on the lateral faces of the light emitting diode elements 11, the reflective members 12 are preferably disposed to cover the entire lateral faces of the light emitting diode elements 11.

Each member of the LED module 100 will be explained next.

LED Device

The LED devices 10 are preferably of a CSP-type (stands for "Chip Size Packages" or "Chip Scale Packages") where reflective members 12 are disposed on the lateral faces of the light emitting diode elements 11, rather than the type that provides a housing for each light emitting diode element 11. In the case of a CSP-type LED device 10, a reflective member 12 may also extend downwardly from a positions lateral to the light emitting diode element, and disposed under the light emitting diode element 11. It is preferable for a CSP-type LED device to have metal terminals for external connection such as metal bumps or post electrodes for the n-side electrode 15a and the p-side electrode 15b. This allows for the LED devices 10 to be arranged closely to one another on the mounting board 20. This increases the number of the LED devices that can be arranged on the mounting board 20, thereby improving the luminous intensity of the LED module 100. By arranging the LED devices 10 close to one another, the emission face of the LED module 100 can emit light more uniformly when viewed from the top. When arranging the same number of the LED devices 10, arranging the LED devices 10 close to one another can also reduce the size of the mounting board 20 thereby reducing the materials cost. Specifically, an LED device 10 can have a substantially rectangular shape of about 1 mm to about 2 mm per side as viewed from the top. Considering the mounting accuracy of the LED devices 10 arranged close to one another on the mounting board 20, each distance between the light emitting diode elements 11 is preferably in a range of about 0.4 mm to about 1.2 mm, and each distance between the LED devices is preferably about 0.2 mm to about 1 mm.

Figure 7:
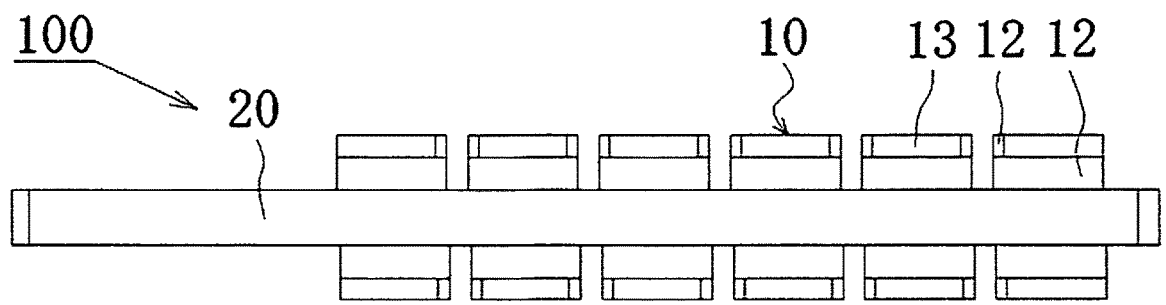
FIG. 7 is a schematic right side view of a variation of the LED module.

Preferably, the LED devices 10 are arranged in a matrix when viewed from the top. This can make it easier to mount the LED devices 10 as well as making it easier to design the wiring pattern of the mounting board 20 for mounting the LED devices 10. In addition, because the LED devices 10 are rectangular in shape when viewed from the top, they can be densely arranged to the outermost perimeter of the mounting board 20. It is also preferable for the LED devices 10 to be serially connected. This can make the current values of the LED devices 10 substantially the same, and thus the light emitted from the LED devices 10 can be substantially uniform. Furthermore, as shown in FIG. 7, the LED devices 10 are preferably arranged on both the upper face and the lower face of the mounting board 20. This allows for the LED module 100 to emit light not only from the upper face but also from the lower face, and thus the light distribution of the LED module 100 can be further widened.

The LED module 100 is produced by arranging the combination of the first LED devices 10a and the second LED devices 10b. The first LED devices 10a and the second LED devices 10b can be produced, for example, by the method described below. In the explanation below, the second LED devices 10b are used by way of example.

Figure 5A:
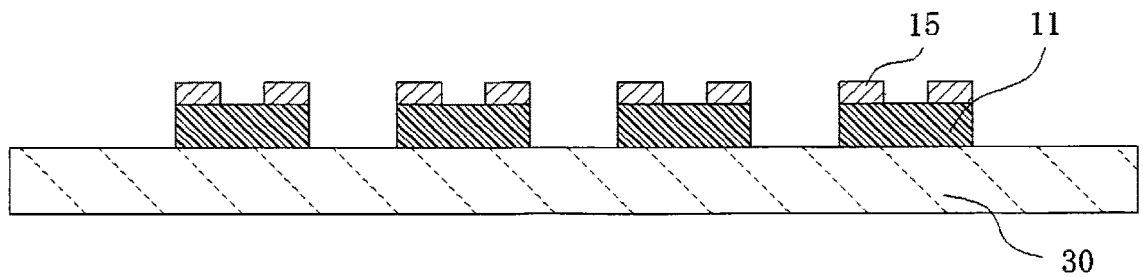
FIGS. 5A-5H each show a series of schematic cross-sectional views illustrating a method for manufacturing the first LED devices.
Figure 5B:
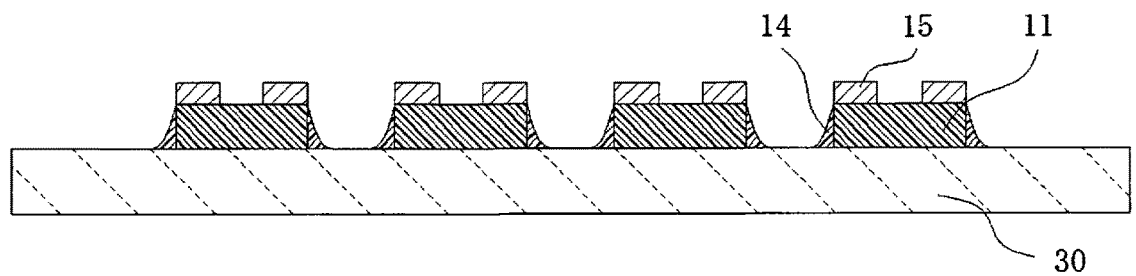
Figure 5C:
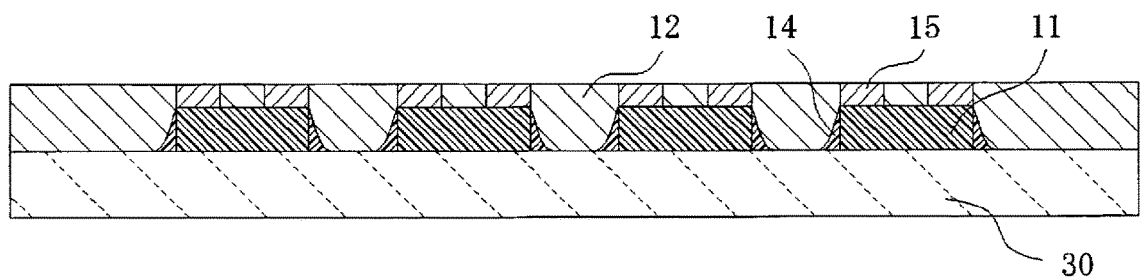
Figure 5D:
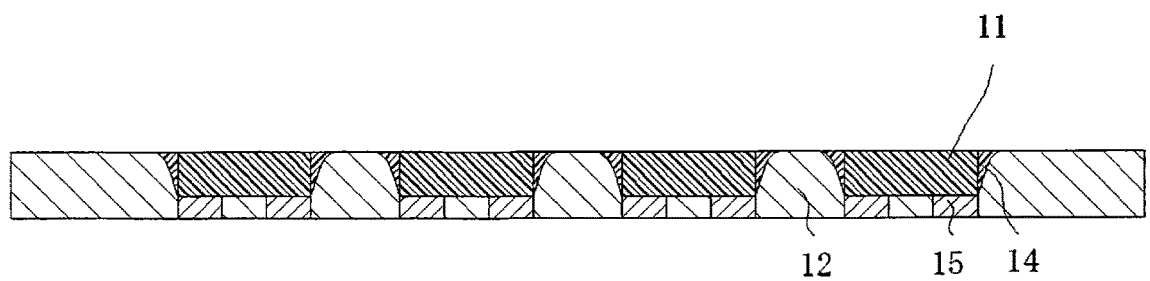
Figure 5E:
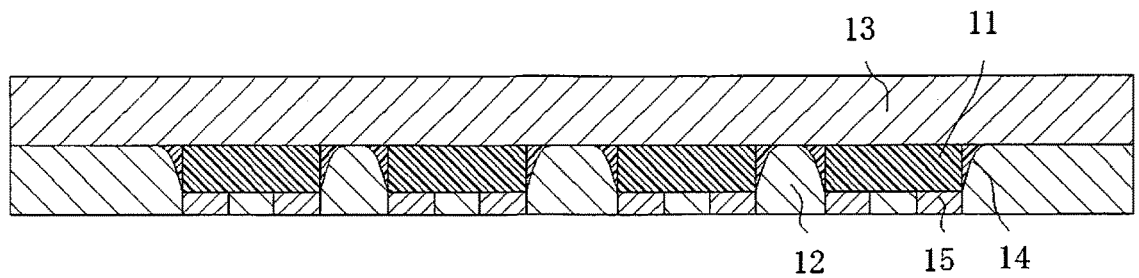
Figure 5F:
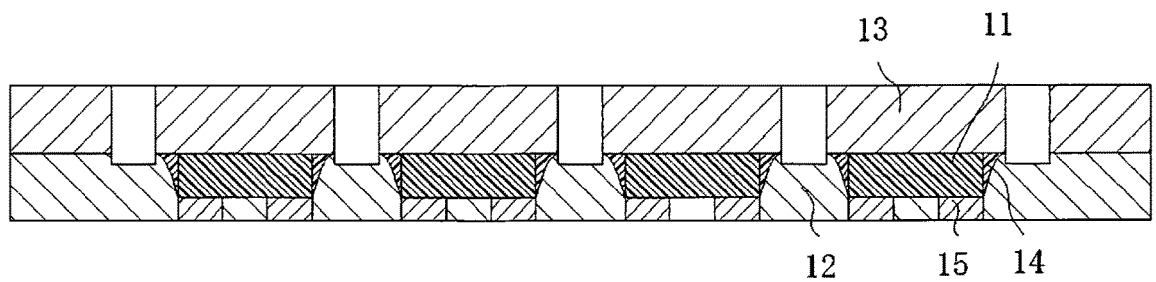
Figure 5G:
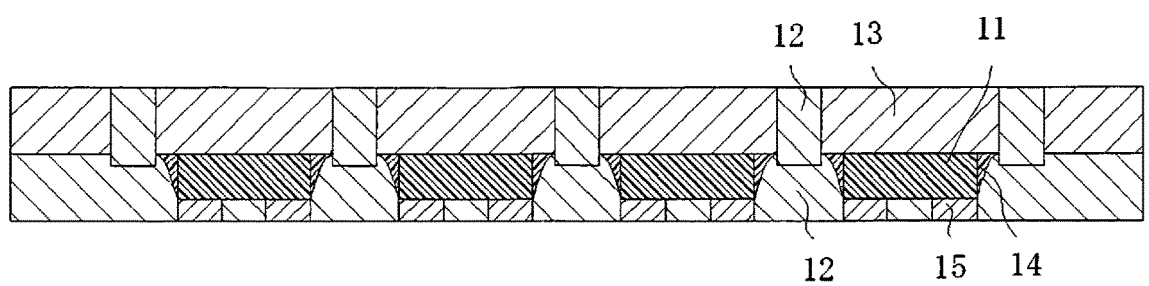
Figure 5H:
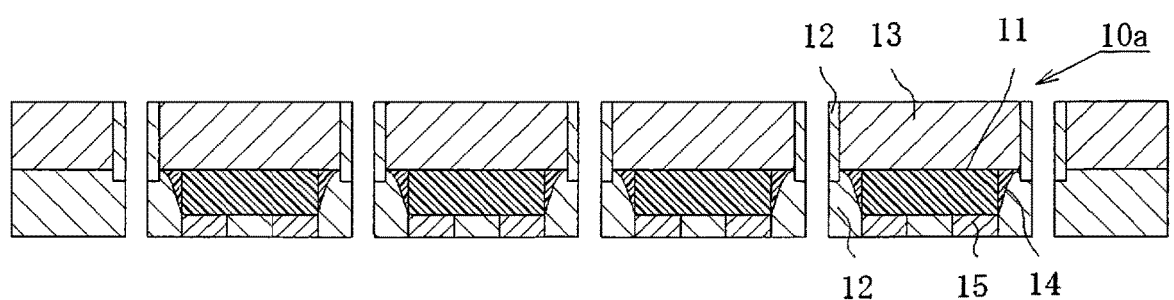

As shown in FIG. 5A, a support substrate 30 is provided, and the light emitting diode elements 11 are arranged on the upper face of the support substrate 30 with the electrode 15 side up. Then, as shown in FIG. 5C, the light emitting diode elements 11 and the surrounding of the light emitting diode elements 11 are embedded with a reflective member 12 so that the electrodes 15 of the light emitting diode elements 11 are exposed at the upper face of the reflective member 12. The reflective member 12 is made of, for example, a white resin. Optionally, as shown in FIG. 5B, the second light transmissive member 14 described later may be disposed on the lateral faces of the light emitting diode elements 11 prior to disposing the reflective member 12. Subsequently, as shown in FIG. 5D and FIG. 5E, the support substrate 30 is removed, and a first light transmissive member 13 is disposed in the area where the support substrate 30 has been removed. The first light transmissive member 13, for example, is a phosphor sheet. This provides the first light transmissive member 13 on the emission face side of the light emitting diode elements 11. Subsequently, as shown in FIG. 5F and FIG. 5G, certain portions of the first light transmissive member 13 disposed on the emission face side of the light emitting diode elements 11 are removed, and a reflective member 12 is disposed in the removed areas. Then, as shown in FIG. 5H, second LED devices 10b can be obtained by separating the light emitting diode elements 11 into individual pieces by cutting the first light transmissive member 13 and the reflective member 12.

At this time, by partly removing the first light transmissive member 13 and replacing it with a reflective member 12 in such a manner as to surround two adjacent light emitting diode elements 11 when viewed from the top, two pieces of second LED devices 10b each having a light extraction face on one lateral face can be simultaneously obtained. Similarly, by partly removing the first light transmissive member 13 and replacing it with a reflective member 12 in such a manner as to surround four adjacent light emitting diode elements 11 when viewed from the top, four pieces of second LED devices 10b each having two light extraction faces on two adjacent lateral surfaces can be simultaneously obtained. As shown in FIGS. 6A to 6H, the first LED devices 10a can be obtained using the similar method. In this case, by partly removing the first light transmissive member 13 and replacing it with the reflective member 12 in such a manner as to surround each of the light emitting diode element 11 when viewed from the top, a piece of first LED device 10a can be obtained.

Figure 6A:
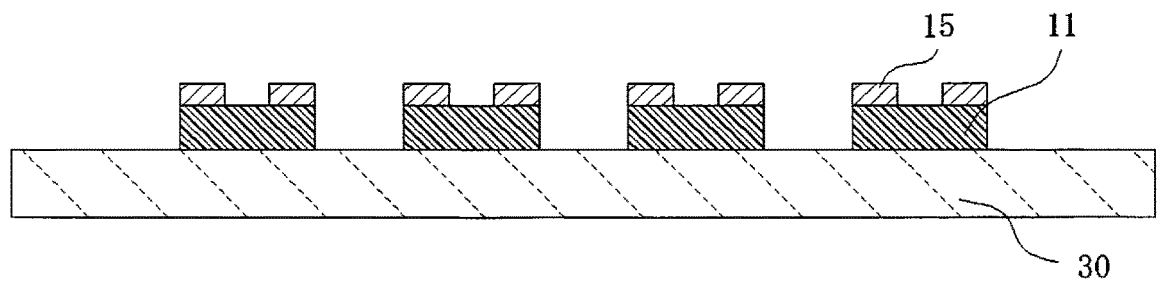
FIGS. 6A-6H each show a series of schematic cross-sectional views illustrating a method for manufacturing the second LED devices.
Figure 6B:
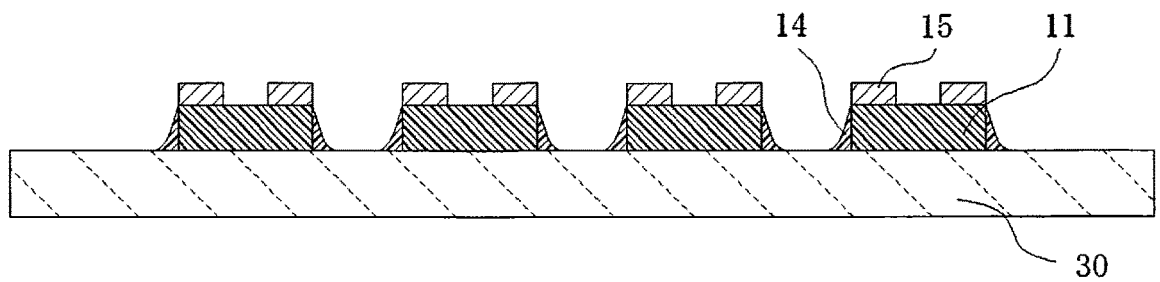
Figure 6C:
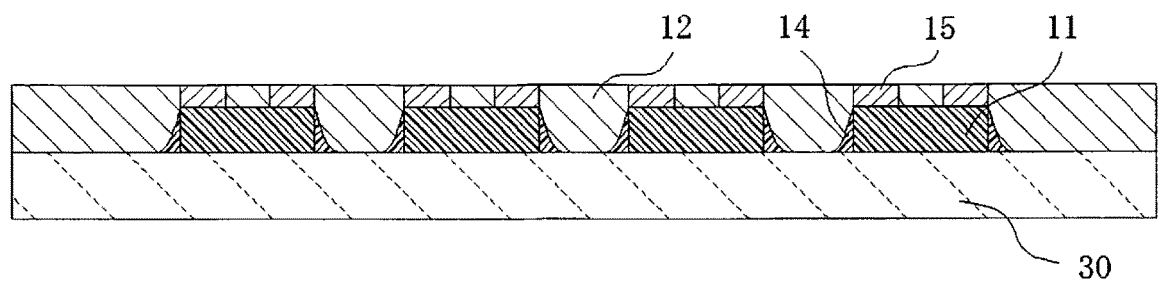
Figure 6D:
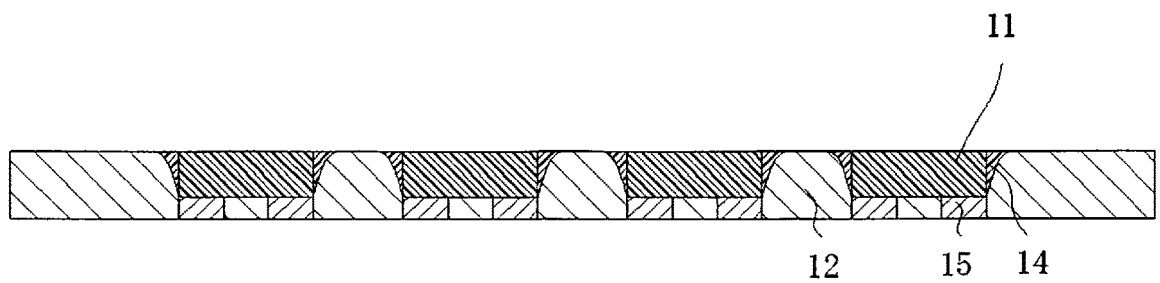
Figure 6E:
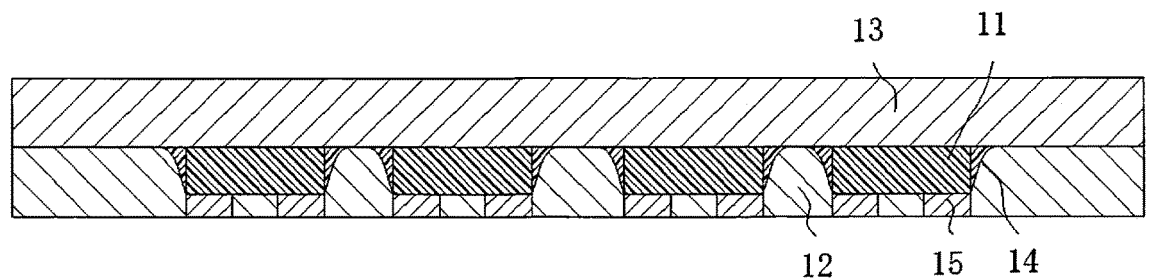
Figure 6F:
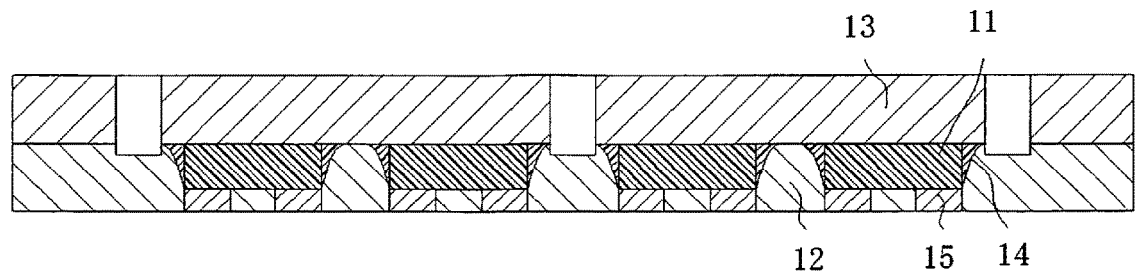
Figure 6G:
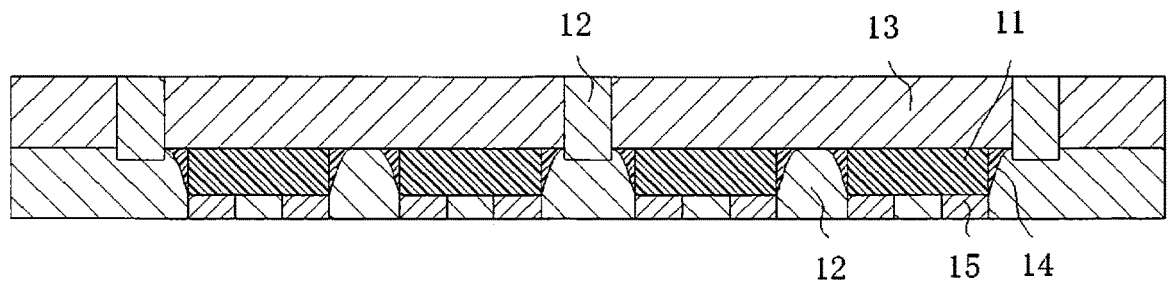
Figure 6H:
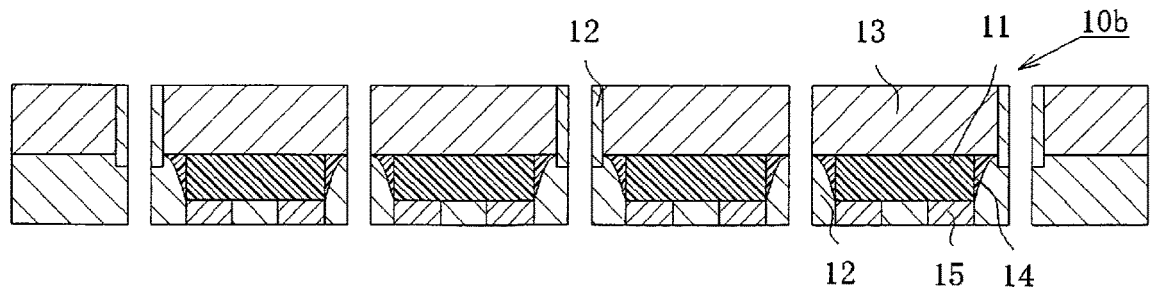

As shown in FIG. 5F and FIG. 6F, in partly removing the first light transmissive member 13, it is preferable to also partly remove the reflective member 12 in the vicinities of the areas where the first light transmissive member 13 and the reflective member 12 are in contact with one another. This can reduce the likelihood of allowing the portions of the first light transmissive member 13 that should be removed to remain unremoved. This can consequently reduce the likelihood of the light being released from the lateral faces of the first light transmissive members 13 of the first LED devices 10a and the second LED devices 10b that are adjacent to other LED devices. Moreover, the depths of removal of the reflective members 12 is preferably smaller than one half of the thickness of the reflective member 12. This allows for most of the reflective members 12 to remain, thereby maintaining the strength of the LED devices 10.

In partly removing the first light transmissive member 13, moreover, it is preferable to not remove the second light transmissive members 14. This allows for the second light transmissive members 14 to maintain the oblique faces described later, and thus can more readily reflect the light from the light emitting diode elements 11.

Light Emitting Diode Element

A semiconductor light emitting element can be used for the light emitting diode element 11. The semiconductor light emitting element can include a light transmissive substrate and a semiconductor layer formed thereon. For the light transmissive substrate, for example, a light transmissive insulating material such as sapphire ($Al_2O_3$), or a semiconductor that can transmit the light emitted by the semiconductor layer, for example, a nitride-based semiconductor. The semiconductor layer includes, for example, a first conductivity type semiconductor layer (e.g., an n-type semiconductor layer), an emission layer, and a second conductivity type semiconductor layer (e.g., a p-type semiconductor layer). The semiconductor layer can be formed of a semiconductor material such as III-V Group compound semiconductor. Specifically, nitride-based semiconductors, such as $In_XAl_YGa_{1-X-Y}N$ ($0 \leq X$, $0 \leq Y$, $X+Y \leq 1$), for example, InN, AlN, GaN, InGaN, AlGaN, InGaAlN, or the like, can be used.

Reflective Member

The reflective member 12 can be formed using, for example, a metal layer or a white resin. The reflective member 12 which is disposed on each lateral face of a light emitting diode element 11 preferably has an oblique face on the light emitting diode element 11 side such that the distance from the lateral face of the light emitting diode element 11 to the oblique face increases as a distance from the mounting board 20 to the oblique face increases. This allows the light from the light emitting diode element 11 to hit the oblique face of the reflective member 12 to travel mainly towards the top. As a result, the light extraction efficiency of the LED device 10 can be increased as compared to the case of a reflective member 12 without an oblique face. Moreover, forming the lateral faces of the reflective member 12 as curved faces can facilitate the reflection of the light from the light emitting diode element 11 towards the top of the LED device 10, further increasing the light extraction efficiency of the LED device 10.

Second Light Transmissive Member

The second light transmissive member 14 can be disposed between the reflective member 12 and the light emitting diode element 11. This allows for the light from a light emitting diode element 11 to be readily reflected by the reflective member 12. Examples of the materials for the second light transmissive member 14 include silicone resins, epoxy resins, and the like. The second light transmissive member 14 preferably has an oblique face on the reflective member 12 side such that the distance from the light emitting diode element 11 to the oblique face increases as a distance from the mounting board 20 to the oblique face increases. This makes it possible to form the reflective member 12 along the slant of the second light transmissive member 14.

The second light transmissive member 14 having such a slant can be formed, for example, by the method described below. A light emitting diode element 11 is placed on the support substrate 30 with the electrode 15 side up. Then, in the case of using the second light transmissive member 14 formed of a light transmissive resin material, the liquid resin material which is the material for the second light transmissive member 14 is applied along the borders between the light emitting diode element 11 and the support substrate 30 using a dispenser or the like. The liquid resin material spreads on the support substrate 30 while creeping on the lateral faces of the light emitting diode element 11 due to surface tension. The liquid resin material is subsequently cured by heating or the like to obtain the second light transmissive member 14. This results in the slanted second light transmissive member 14. The reflective member 12 can be formed in such a manner as to cover the oblique surfaces of such a second light transmissive member 14.

The distance of the liquid resin material creeping on the light emitting diode element 11 can be controlled by adjusting the viscosity and the amount of the liquid resin material. The viscosity of the liquid resin material can be adjusted by adding a filler or the like.

First Light Transmissive Member

Figure 4:
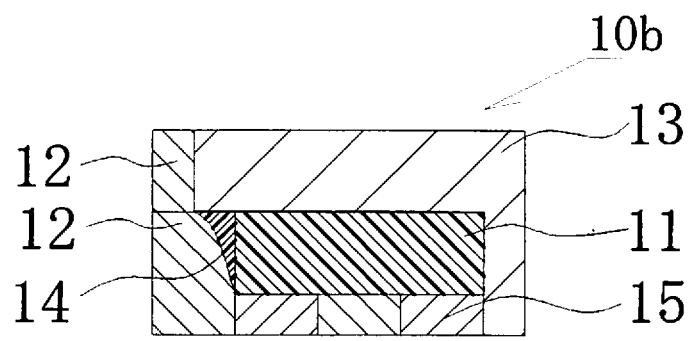
FIG. 4 is a schematic cross-section view of a variation of the second LED device.

The light extraction face of an LED device 10 is constructed with a first light transmissive member 13. For example, the first light transmissive member 13 can be composed of a light transmissive material alone, or a light transmissive material which contains a phosphor. If the first light transmissive member 13 contains at least one phosphor, the light from the light emitting diode element 11 can be converted, and the converted light can be extracted. The first light transmissive member 13 is preferably disposed to cover the entire path of light from the light emitting diode element 11 to the light extraction face of the LED device 10. Furthermore, it is preferable that the light extraction face of the LED device 10 is formed of the first light transmissive member 13 in its entirety. In this manner, the light from the light emitting diode element 11 can be extracted, and the light emitting diode element 11 can be protected from the external factors. Moreover, the first light transmissive member 13 containing one or more phosphors and/or one or more scattering agents can reduce color non-uniformity of the light released from the LED device 10. As shown in FIG. 4, it is preferable to dispose the first light transmissive member 13 on the lateral faces of the light emitting diode element 11 of a second LED device 10b that are not adjacent to any other LED devices 10. In this manner, the light is also released from the lateral faces of the light emitting diode elements 11, thereby further widening the light distribution of the LED module 100. Examples of materials for the light transmissive materials include light transmissive resins, glass, or the like. Examples of materials for the light transmissive resins include thermosetting resins such as silicone resins, silicone modified resins, epoxy resins, phenol resins, or the like, and thermoplastic resins such as polycarbonate resins, acrylic resins, methylpentene resins, polynorbornene resins or the like. Particularly, silicone resins are preferable due to its highly light resistant and heat resistant.

For phosphors, those that can be excited by the emitted light from the light emitting diode elements 11 are used. Example of phosphors excitable by blue light or ultraviolet light include cerium-activated yttrium aluminum garnet-based phosphors; cerium-activated lutetium aluminum garnet-based phosphors; europium- and/or chromium-activated nitrogen-containing calcium aluminosilicate-based phosphors; europium-activated silicate-based phosphors; nitride-based phosphors, such as β-SiAlON phosphors, CASN-based phosphors, SCASN-based phosphors; KSF-based phosphors; sulfide-base phosphors; and quantum dot phosphors. By combining these phosphors with a blue light emitting diode element 11 or an ultraviolet light emitting diode element 11, LED devices of various emission colors (e.g., a white-based LED device 10) can be manufactured. The first light transmissive member 13 can contain various fillers for the purpose of, for example, adjusting the viscosity. In the case of using a silicone resin as the main material for the first light transmissive member 13, the first light transmissive member 13 may be covered with a coating film made of an epoxy resin having a low tack adhesive as the main material.

Mounting Board

On the mounting board 20, LED devices 10 are mounted. It is preferable to form a wiring pattern on the surface of the mounting board 20 for supplying an electric current. By arranging the LED devices 10 on the wiring pattern and connecting the electrodes 15 of the LED devices 10 to the wiring pattern using metal bumps, a conductive bonding agent, or the like, an electric current can be supplied to the LED devices 10. Specifically, an aluminum mounting board, copper mounting board, AlN mounting board, SiC mounting board, or the like can be used for the mounting board 20.

What is claimed is:

1. An LED module comprising:
   a mounting board; and
   a plurality of LED devices arranged adjacent to one another on the mounting board, the LED devices including
      at least one first LED device with all lateral faces facing corresponding ones of the plurality of LED devices, the at least one first LED device including a light emitting diode element, a light transmissive member disposed above the light emitting diode element, and a reflective member disposed lateral to all lateral faces of the light emitting diode element with the reflective member further covering all lateral faces of the light transmissive member so that an upper face of the at least one first LED device serves as a light extraction face, the reflective member being in contact with at least the light transmissive member, and
      a plurality of second LED devices each having at least one lateral face facing at least one of the LED devices and at least one lateral face not facing any one of the LED devices, the second LED devices each including a light emitting diode element, a light transmissive member disposed above the light emitting diode element, and a reflective member disposed lateral to all lateral faces of the light emitting diode element with the reflective member further covering each of at least one lateral face of the light transmissive member facing the at least one of the LED devices with the reflective member not covering each of at least one lateral face of the light transmissive member not facing any one of the LED devices so that each of the at least one lateral face of the light transmissive member not facing any one of the LED devices and an upper face of a corresponding one of the second LED devices serve as light extraction faces, the reflective member being in contact with at least the light transmissive member, wherein
   a part of the reflective member of one of the LED devices and a part of the reflective member of an adjacent one of the LED devices face each other while being spaced apart from each other.

2. The LED module according to claim 1, wherein each of the reflective members disposed lateral to the light emitting diode element has an oblique face facing the light emitting diode element such that a distance from the light emitting diode element to the oblique face increases as a distance from the mounting board to the oblique face increases.

3. The LED module according to claim 2, wherein the oblique face of each of the reflective members is curved.

4. The LED module according to claim 1, wherein each of the reflective members extends downwardly from a position lateral to the light emitting diode element, and is disposed under the light emitting diode element.

5. The LED module according to claim 1, wherein each of the reflective members includes white resin or a metal layer.

6. The LED module according to claim 1, wherein the light transmissive member is made of light transmissive resin or glass.

7. The LED module according to claim 1, wherein the light transmissive member contains at least one phosphor.

8. The LED module according to claim 1, wherein the light transmissive member covers an entire path of light from the light emitting diode element.

9. The LED module according to claim 1, wherein all of the light extraction faces are formed with the light transmissive member.

10. The LED module according to claim 1, wherein each of the LED devices includes a second light transmissive member disposed between the reflective member and the light emitting diode element.

11. The LED module according to claim 10, wherein the second light transmissive member is made of silicone resin or epoxy resin.

12. The LED module according to claim 1, wherein a distance between adjacent ones of the LED devices is in a range from 0.2 mm to 1 mm.

13. The LED module according to claim 1, wherein the LED devices are arranged in a matrix when viewed from the top.

14. The LED module according to claim 1, wherein the LED devices are serially connected.

15. The LED module according to claim 1, wherein the LED devices are disposed on an upper face and a lower face of the mounting board.

16. The LED module according to claim 1, wherein the reflective member of the at least one first LED device includes a first portion disposed lateral to all the lateral faces of the light emitting diode element, and a second portion covering all the lateral faces of the light transmissive member, the first portion being separately formed from the second portion, and
the reflective member of each of the second LED devices includes a first portion disposed lateral to all the lateral faces of the light emitting diode element, and a second portion covering each of the at least one lateral face of the light transmissive member facing the at least one of the LED devices, the first portion being separately formed from the second portion.

17. An LED module comprising:
a mounting board; and
a plurality of LED devices arranged adjacent to one another on the mounting board, the LED devices including
  at least one first LED device with all lateral faces facing corresponding ones of the plurality of LED devices, the at least one first LED device including a light emitting diode element, a light transmissive member disposed above the light emitting diode element, and a reflective member disposed lateral to all lateral faces of the light emitting diode element with the reflective member further covering all lateral faces of the light transmissive member so that an upper face of the at least one first LED device serves as a light extraction face, and
  a plurality of second LED devices each having at least one lateral face facing at least one of the LED devices and at least one lateral face not facing any one of the LED devices, the second LED devices each including a light emitting diode element, a light transmissive member disposed above the light emitting diode element, and a reflective member disposed lateral to all lateral faces of the light emitting diode element with the reflective member further covering each of at least one lateral face of the light transmissive member facing the at least one of the LED devices with the reflective member not covering each of at least one lateral face of the light transmissive member not facing any one of the LED devices so that each of the at least one lateral face of the light transmissive member not facing any one of the LED devices and an upper face of a corresponding one of the second LED devices serve as light extraction faces and so that the each of at least one lateral face of the light transmissive member facing the at least one of the LED devices does not serve as a light extraction face.

18. The LED module according to claim 17, wherein the reflective member of the at least one first LED device includes a first portion disposed lateral to all the lateral faces of the light emitting diode element, and a second portion covering all the lateral faces of the light transmissive member, the first portion being separately formed from the second portion, and
the reflective member of each of the second LED devices includes a first portion disposed lateral to all the lateral faces of the light emitting diode element, and a second portion covering each of the at least one lateral face of the light transmissive member facing the at least one of the LED devices, the first portion being separately formed from the second portion.

* * * * *